United States Patent [19]
Arai et al.

[11] Patent Number: 5,315,072
[45] Date of Patent: May 24, 1994

[54] PRINTED WIRING BOARD HAVING BLIND HOLES

[75] Inventors: Kunio Arai, Atsugi; Yasuhiko Kanaya, Machida, both of Japan

[73] Assignee: Hitachi Seiko, Ltd., Ebina, Japan

[21] Appl. No.: 827,708

[22] Filed: Jan. 27, 1992

[51] Int. Cl.$^5$ .............................................. H05K 1/00
[52] U.S. Cl. .................................... 174/262; 174/250; 174/261; 361/784
[58] Field of Search ............. 174/250, 254, 255, 261, 174/264, 262; 361/412, 414; 428/901; 29/830, 846

[56] References Cited

U.S. PATENT DOCUMENTS 3,546,775  12/1970  Lalmond et al. ................. 29/846 X
4,751,126   6/1988  Oodaira et al. .................. 29/830 X Primary Examiner—Leo P. Picard
Assistant Examiner—Cheryl R. Figlin
Attorney, Agent, or Firm—Wenderoth, Lind & Ponack

[57] ABSTRACT

The present invention relates to a printed wiring board and a method of manufacturing a printed wiring board. A first printed wiring board and a second printed wiring board, each including an insulating layer and a copper foil layer, are superposed on one another with a middle insulating layer therebetween with blind holes formed in the insulating layers of the boards to oppose one another, through-holes are formed and provided with conductive plating to electrically connect the copper foil layers with each other, and reflow pads are formed by etching in the copper foil layers to seal the blind holes. The blind holes are formed through the insulating layers and reach the copper foil layers. Plated layers are plated on the surfaces of the printed wiring boards on the sides thereof where the blind holes are formed to electrically connect the blind holes and the copper foil layers, respectively.

4 Claims, 6 Drawing Sheets

Fig. I(A)
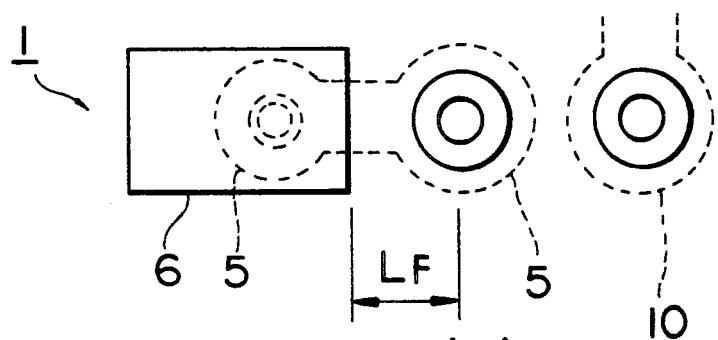
Fig. I(B)
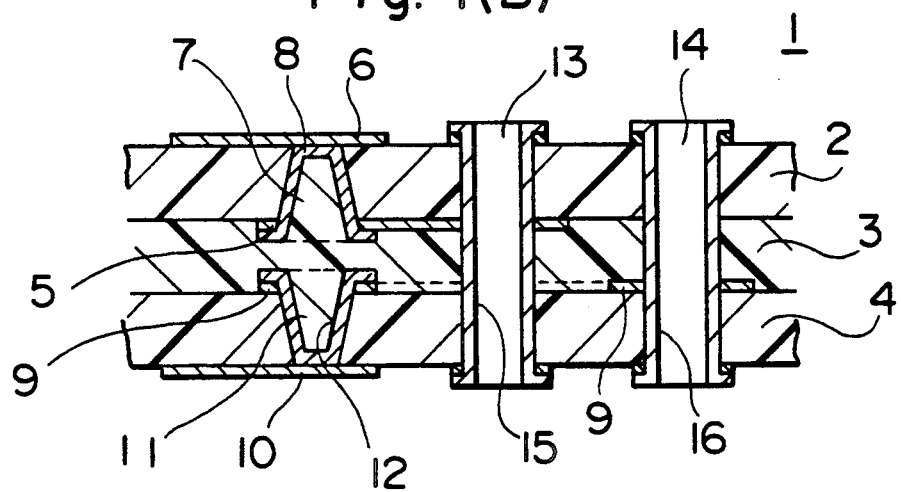

PRINTED WIRING BOARD HAVING BLIND HOLES

BACKGROUND OF THE INVENTION

1. Field of the Invention

This invention relates to a printed wiring board, and particularly to a printed wiring board capable of being connected by blind holes which allow for high density mounting of components, and to a method of manufacturing the printed wiring board.

2. Description of the Prior Art

A conventional printed wiring board is described below with reference to FIGS. 3(A) and 3(B).

More specifically, a printed wiring board 100 includes a dielectric resin substrate 102, copper conductor pads (inner layer pattern) 104 and 109 on opposing surfaces of the substrate 102, dielectric resin layers 101 and 103 laminated on opposing surfaces of the substrate 102, outer layer copper reflow pads 108 and 113, and outer layer copper conductor lines 105 and 110. Blind holes 106 and 111 which have copper plating layers 107 and 112 are formed in the dielectric resin layers 101 and 103. Plated through holes 114 and 115 are formed through the layers 101 and 103 and the substrate 102 and have through hole copper plating layers 116 and 117 for connecting outer layers with the inner pads 104 and 109.

The reflow pads 108 and 113 which mount electric components on the surface are connected to the copper layers 107 and 112 of the blind holes 106 and 111 by narrow conductor lines 105 and 110.

The inner layer conductor pads 104 and 109 are connected to the narrow conductor lines 105 and 110, and thus the outer layers 108 and 113, by the copper plating layers 107 and 112 of the blind holes 106 and 111.

FIG. 4(A)–FIG. 4(G) illustrate a conventional printed wiring board manufacturing process which uses a laser beam.

In the first step of the process, the inner layer conductor pads 104 and 109 are etched and formed on both surfaces of the dielectric resin substrate 102 as shown in FIG. 4(A).

In the second step of the process, the dielectric resin layers 101 and 103, and copper foil layers (outer layers) 105a and 110a are laminated and pressed onto the substrate, as etched and formed in the first step shown in FIG. 4(A), in a heated environment.

In the third step of the process, special windows 118 and 119, through which a laser beam can be radiated, are etched as shown in FIG. 4(C).

In the fourth step of the process, laser beams 120 are radiated through the windows 118 and 119 to form blind holes 106 and 111 which reach the inner layer conductor pads 104 and 109, as shown in FIG. 4(D).

In the fifth step of the process, through holes 114 and 115 are drilled as shown in FIG. 4(E).

In the sixth step of the process, blind holes 106 and 111, and through holes 114 and 115 are plated with plating layers 107, 112, 116 and 117 as shown in FIG. 4(F) for connecting the copper foil layers 105a and 110a with the inner layer pads 104 and 109.

In the last step of the process, the copper foil layers 105a and 110a are etched to form narrow outer layer conductor lines 105 and 110 and reflow pads 108 and 113, as shown in FIG. 4(G).

However, as stated above, on the conventional printed wiring board 100, the reflow pads 108 and 113 are used only for mounting surface mount components, and the narrow conductor lines 105 and 110 are used only for connecting to the blind holes 106 and 111, respectively, because the conductor pads around the blind holes 106 and 111 are higher than the outer layer copper areas and flat surfaces are necessary for mounting the surface mount components.

Accordingly, the maximum mounting density for surface mounted components is relatively low.

Furthermore, high density wiring boards with many layers printed thereon are manufactured by repeating the above process, and the conductor pads (inner layer patterns) 104 and 109 are largely shifted from their specified positions due to material thermal expansion. When, in the laser process, the blind holes are formed in positions offset from the inner layer conductor pads, the conductive areas of the hole bottoms become smaller than the specified area.

SUMMARY OF THE INVENTION

A printed wiring board manufactured according to the present invention is configured to include at least a dielectric resin layer and two outer layer boards, each composed of a resin layer and two outer copper layers which form conductor pads and reflow pads. The conductor pads and reflow pads are connected by blind holes, where the blind holes face inwardly toward one another, rather than outwardly as in conventional wiring boards.

Furthermore, a method of manufacturing a printed wiring board according to the present invention is such that a first printed wiring board and a second printed wiring board are provided with blind holes inwardly of the reflow pads and, after laminating, through holes are drilled.

The first printed wiring board and the second printed wiring board composed of dielectric resin layers and two outer copper layers are independently manufactured and have blind holes drilled therein and then the two outer layers are plated and etched to form blind hole pads and inner layer conductor pads.

Then, a first printed wiring board and a second printed wiring board are located against and laminated with a dielectric resin layer (with the blind holes facing inwardly).

BRIEF EXPLANATION OF THE DRAWINGS

FIG. 1(A) is a plan view showing an embodiment of a printed wiring board according to the present invention;

FIG. 1(B) is a sectional front view of the printed wiring board shown in FIG. 1(A);

FIG. 4(A) to FIG. 4(H) are sectional front views showing the manufacturing steps of a conventional method of manufacturing a conventional printed wiring board.

DETAILED DESCRIPTION OF THE INVENTION

Figure 2A:
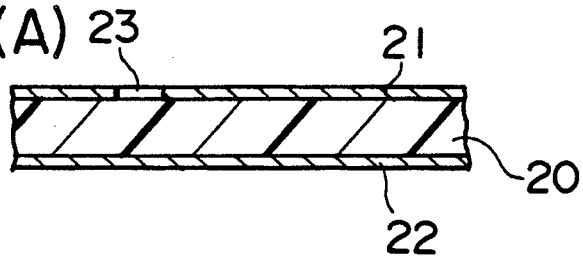
FIGS. 2(A) to 2(I) are sectional front views showing the manufacturing steps involved in the method of manufacturing the printed wiring board according to an embodiment of the present invention.

An embodiment of the present invention will be described below with reference to FIGS. 1(A), 1(B), and 2(A)2(I).

FIGS. 1(A) and 1(B) show an embodiment of the printed wiring board according to the present invention.

As shown in FIGS. 1(A) and 1(B), a printed wiring board 1 includes a dielectric resin layer 3, and two outer layer boards respectively composed of resin layers 2 and 4, and two outer copper layers. Blind holes 7 and 11 are formed in the resin layers 2 and 4, and through holes 13 and 14 are formed through the dielectric resin layer 3 and the outer layer boards. The outer copper layers including reflow pads 6 and 10 are located on outer surfaces of the resin layers 2 and 4, respectively, and inner layer conductor pads (inner layers) 5 and 9 are provided on the outer surfaces of the dielectric resin layer 3. Plated layers 8 and 12 are provided in the blind holes 7 and 11, and plated layers 15 and 16 are provided in the through holes 13 and 14 for connecting the reflow pads (outer layers) 6 and 10 with the conductor pads (inner layers) 5 and 9.

Consequently, according to this embodiment, the reflow pads are formed over the blind holes, so that surface mount components can be mounted on the reflow pads and the reflow pads can be used as conductor pads for connecting the inner layer conductor pads to the components.

FIGS. 2(A)-2(I) illustrate an embodiment of a method of manufacturing the printed wiring board according to the present invention.

FIG. 2(A) to FIG. 2(I) illustrate the respective steps for manufacturing the printed wiring board.

In the first step of the process, a window 23 through which a laser beam can be radiated is etched in one 21 of two copper layers 21, 22 formed on a dielectric resin layer 20, as shown in FIG. 2(A).

Figure 2B:
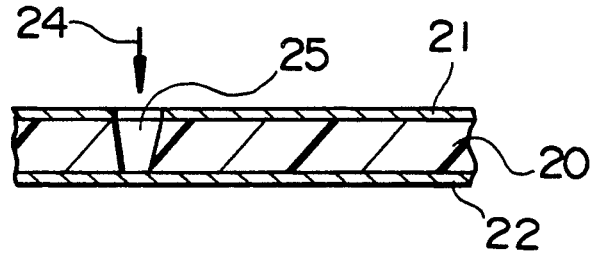

In the second step of the process, a laser beam 24 is radiated through the window 23 to form a hole 25 which reaches the layer 22, as shown in FIG. 2(B).

Figure 2C:
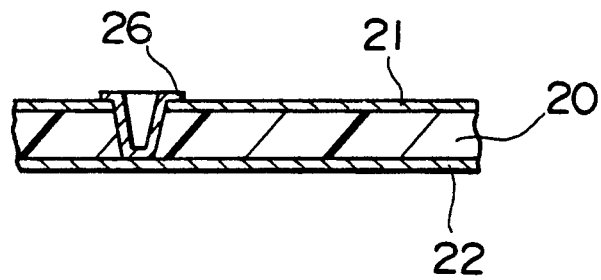

In the third step of the process, the hole 25 is plated with a plating layer 26 to form a bind hole 28 (as well as a blind hole 38 in resin layer 30) to connect the two copper layers 21 and 22, as shown in FIG. 2(C).

Figure 2D:
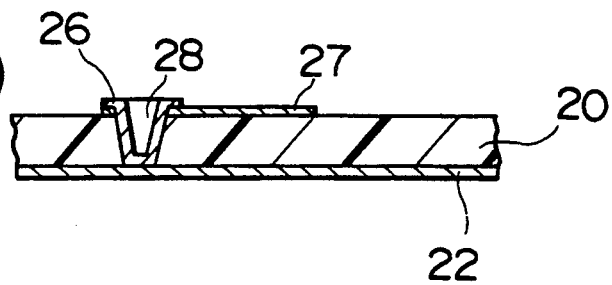
Figure 2E:
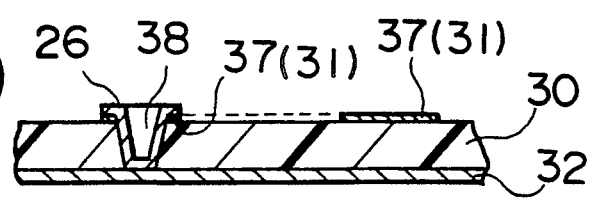

In the fourth step of the process, the copper layers 21 on two dielectric resin layers 20 and 30 are etched to form inner layer conductors 27 and 37 (31), as shown in FIG. 2(D) and FIG. 2(E).

Figure 2F:
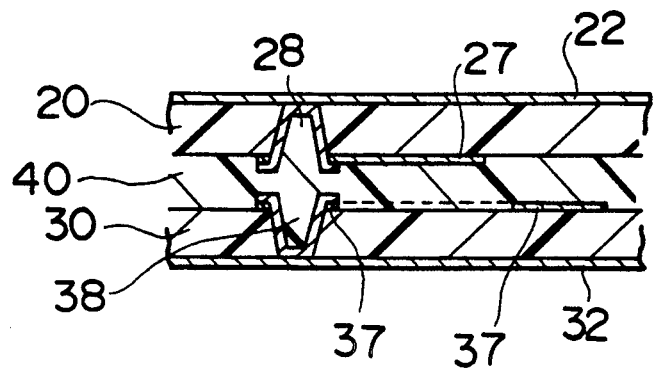

In the fifth step of the process, the two boards are laminated and pressed to the dielectric resin layer 40, with the inner layer conductors 27 and 37 facing the resin layer 40, in a heated environment, as shown in FIG. 2(F).

Figure 2G:
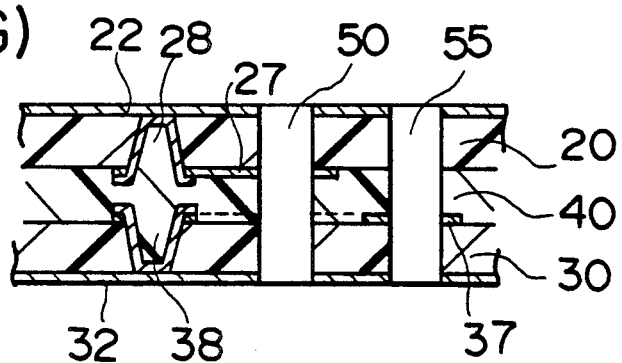

In the sixth step of the process, through holes 50 and 55 are drilled as shown in FIG. 2(G).

Figure 2H:
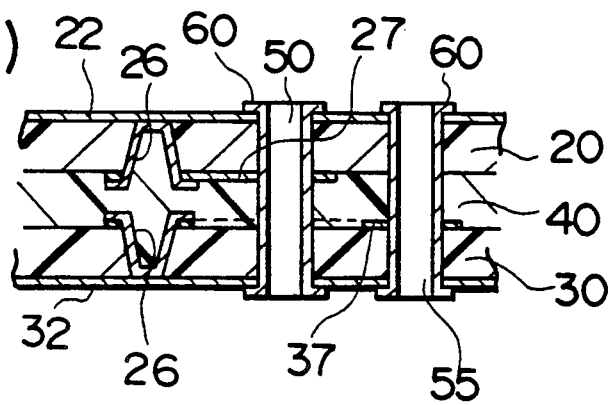

In the seventh step of the process, the through holes 50 and 55 are plated with plating layers 60 to connect outer layers 22 and 32, and inner layer 27 and 37, as shown in FIG. 2(H).

Figure 2I:
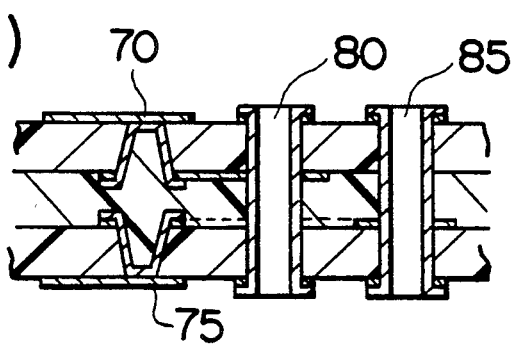
Figure 3A:
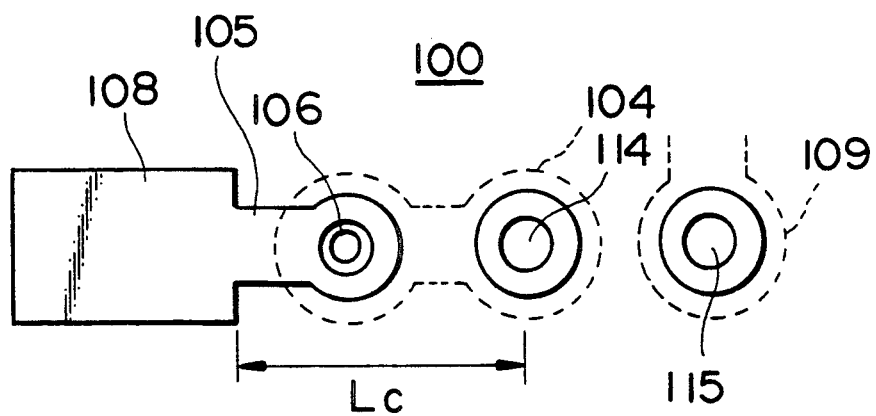
FIG. 3(A) is a plan view showing a conventional printed wiring board.
Figure 3B:
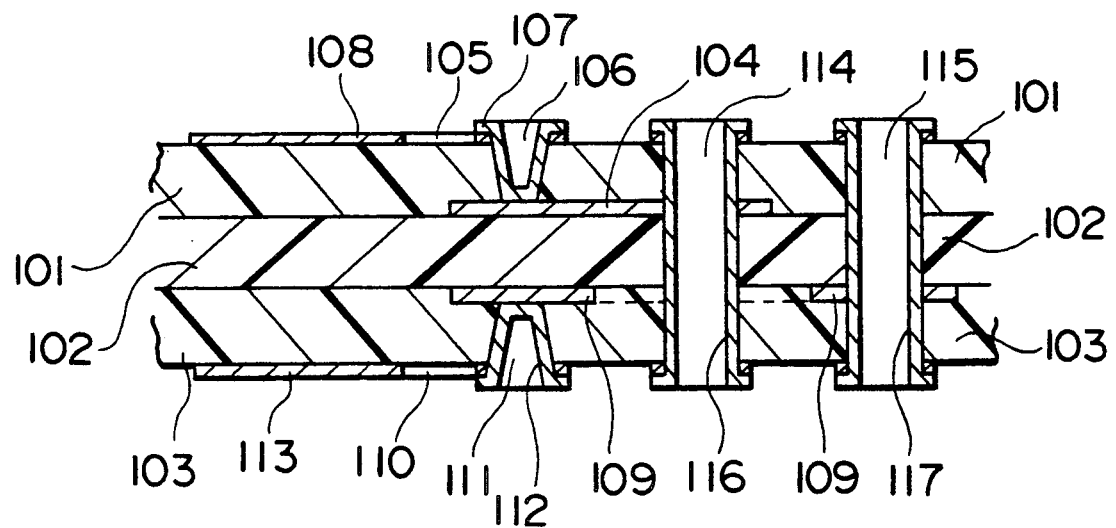
FIG. 3(B) is a sectional front view of the printed wiring board shown in FIG. 3(A)
Figure 4A:
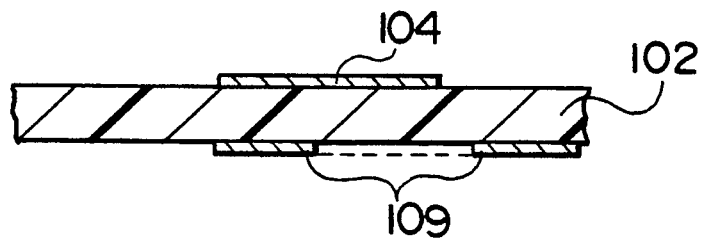
Figure 4B:
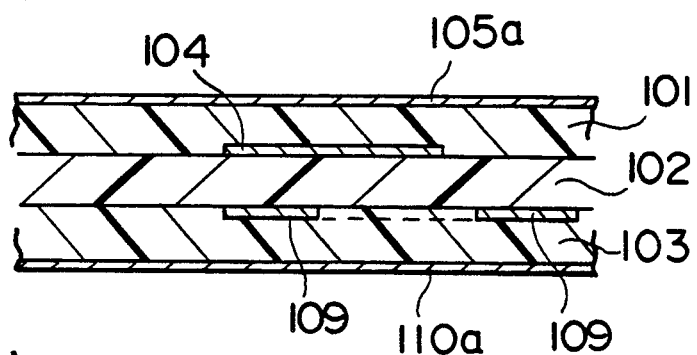
Figure 4C:
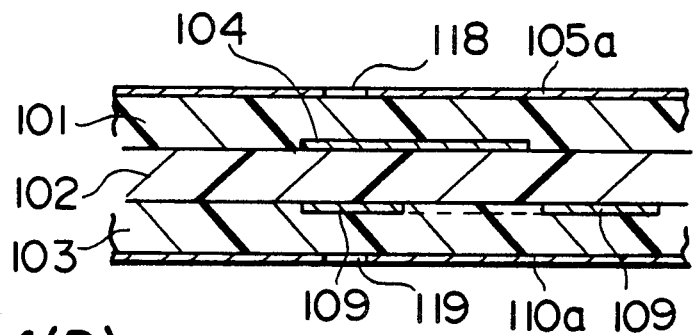
Figure 4D:
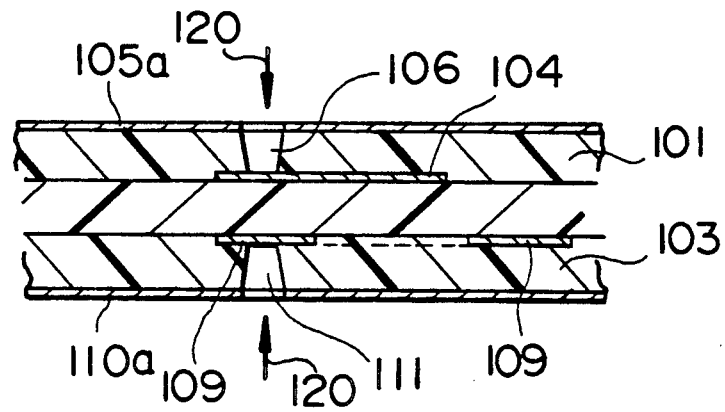
Figure 4E:
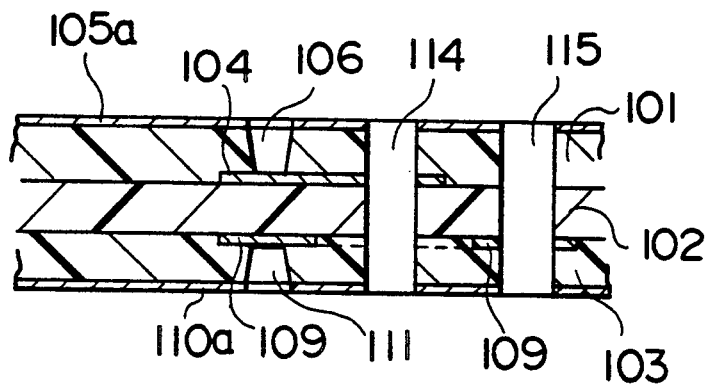
Figure 4F:
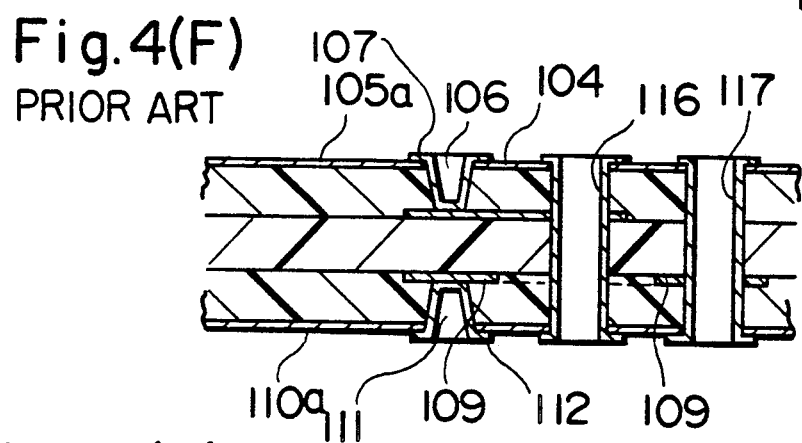
Figure 4G:
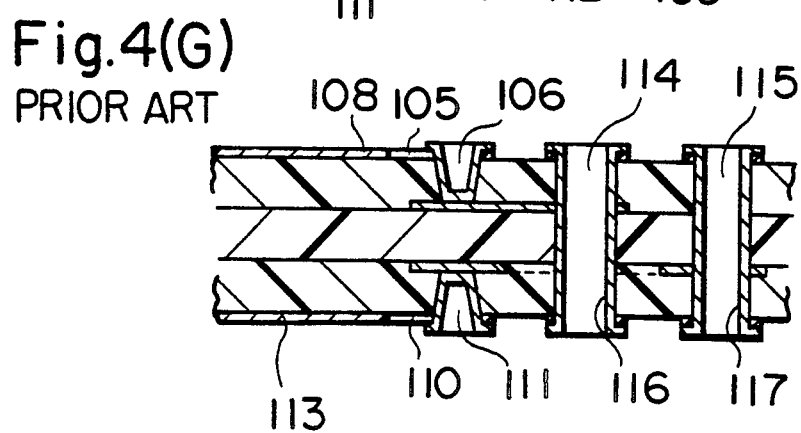

In the last step of the process, outer layers 22 and 32 are etched to form reflow pads 70 and 75 and plating at through holes 80 and 85 as shown in FIG. 2(I).

As stated above, according to the present invention, the mounting area for mounting surface mount components on a printed wiring board is greatly increased by eliminating conventional blind holes in the outer layer pad, and also by eliminating narrow conductor lines between reflow pads and blind hole conductors.

Furthermore, in this method, the blind hole drilling process is performed before the laminating process and the conventional thermal expansion factor is minimized, so the conductive area of the hole bottom can be maintained as a specified area.

What is claimed is:

1. A printed wiring board comprising:
   a dielectric resin layer having first and second opposing surfaces;
   a first outer layer body having inner and outer surfaces and being laminated on said dielectric resin layer with said inner surface of said first outer layer load confronting said first surface of said dielectric resin layer;
   a second outer layer boad having inner and outer surfaces and being laminated on said dielectric resin layer with said inner surfaces of said second outer layer boad confronting said second surface of said dielectric resin layer;
   a first conductor pad mounted between said dielectric resin layer and said first outer layer board;
   a second conductor pad mounted between said dielectric resin layer and said second outer layer board;
   wherein said first outer layer board comprises a first resin layer and a first conductive foil layer on an outer surface of said first resin layer;
   wherein said second outer layer board comprises a second resin layer and a second conductive foil layer on an outer surface of said second resin layer;
   wherein a blind hole is formed in said first resin layer of said first outer layer board and opens through an inner surface of said first resin layer; and
   wherein a conductive plated layer is provided in said blind hole, is conductively connected with said first conductive foil layer, and has a portion which overlaps and conductively contacts said first conductor pad in such a manner that said first conductor pad is disposed between said inner surface of said first outer layer board and said portion of said conductive placed layer which overlaps said first conductor pad.

2. A printed wiring board as recited in claim 1, wherein
   an additional blind hole is formed in said second resin layer of said second outer layer board an opens through an inner surface of said first resin layer; and
   an additional conductive plated layer is provided in said additional blind hole, is conductively connected with said second conductive foil layer, and has a portion which overlaps and conductively contracts said second conductor pad.

3. A printed wiring board as recited in claim 2, wherein
   a through hole is formed through said dielectric resin layer and said first and second outer layer boards; and
   a conductive plated layer is provided in said through hole, has a portion which overlaps and conductively contacts said first conductive foil layer, and has a portion which overlaps and conductively contacts said second conductive foil layer.

4. A printed wiring board as recited in claim 1, wherein a through hole is formed through said dielectric resin layer and said first and second outer layer boards; and a conductive plated layer is provided in said through hole, has a portion which overlaps and conductively contacts said first conductive foil layer, and has a portion which overlaps and conductively contacts said second conductive foil layer.

* * * * *